United States Patent [19]

Hayes

[11] Patent Number: 5,377,902
[45] Date of Patent: Jan. 3, 1995

[54] METHOD OF MAKING SOLDER INTERCONNECTION ARRAYS

[75] Inventor: Donald J. Hayes, Plano, Tex.

[73] Assignee: MicroFab Technologies, Inc., Plano, Tex.

[21] Appl. No.: 180,975

[22] Filed: Jan. 14, 1994

[51] Int. Cl.[6] .......................... B23K 1/20; H05K 3/34
[52] U.S. Cl. .................................. 228/254; 228/219; 228/180.22; 222/590; 427/123
[58] Field of Search .................. 228/102, 180.22, 219, 228/248.1, 254, 33; 222/590, 591, 593, 595; 427/123, 375, 383.7

[56] References Cited

U.S. PATENT DOCUMENTS

| | | | |
|---|---|---|---|
| 3,916,042 | 10/1975 | Grietens | 228/254 |
| 4,934,309 | 6/1990 | Ledermann et al. | 228/33 |
| 4,942,984 | 7/1990 | Miller | 228/248.1 |
| 5,193,738 | 3/1993 | Hayes | 228/254 |
| 5,229,016 | 7/1993 | Hayes et al. | 228/254 |

*Primary Examiner*—Samuel M. Heinrich
*Attorney, Agent, or Firm*—Jack A. Kanz

[57] ABSTRACT

Solder interconnection arrays for joining a plurality of metallic surfaces located on a first surface to a plurality of metallic surfaces located on a second surface are provided which reduce the amount of stress on particular areas of the interconnect array caused by shear forces between the surfaces. The arrays are formed by positioning and maintaining the first surface in a controlled environment; aligning a device for ejecting drops of liquid solder which can be varied in volume from drop to drop to deliver ejected drops of liquid solder to an initial location on the first surface; providing relative movement between the first surface and the ejection device through a predetermined sequence of locations; activating the ejection device to cause a predetermined number of drops of liquid solder of predetermined volume to be ejected and delivered to locations on the first surface predetermined locations to form solid solder deposits which vary in diameter and height from the metallic surfaces in accordance with a predetermined pattern.

21 Claims, 5 Drawing Sheets

METHOD OF MAKING SOLDER INTERCONNECTION ARRAYS

This invention relates generally to dispensing liquid solder. More particularly, but not by way of limitation, it relates to methods for producing spherically-shaped quantities of melted solder of accurately known size and applying the spherically-shaped quantities to an appropriate substrate with great accuracy to provide solder interconnection arrays.

BACKGROUND OF THE INVENTION

In many high density electronic device manufacturing processes, semiconductor integrated circuit chips are bonded to a substrate by a solder reflow process. In the prior art (as illustrated in FIGS. 1 and 2) a surface mountable package such as a microelectronic device package 10, a semiconductor integrated circuit chip or the like is operatively joined to a substrate, printed circuit board or other device 12 after the solder reflow process has been completed. The interconnection material between the microelectronic device package 10 and the substrate or device 12 is in the form of a solder bump, drop, ball or deposit 14 prior to the solder reflow process. The solder bumps or drops 14 are placed on wettable metal pads 16 of the microelectronic device 10 by one of various processes which include (1) deposition through a mask plus solder reflow, (2) electroplating plus solder reflow and (3) pick-and-place of the solder bumps, etc.

The actual bonding processes utilize solder bumps or balls deposited on the wettable metal pads 16 on the microelectronic device 10. Microelectronic device 10 (the upside-down chip or "flip chip") is then flipped over (see FIG. 2) and the solder bumps 14 aligned with the correct matching footprint of solder-wettable terminals, contact pads or bond pads 18 on the substrate 12. Heat is then applied and all joints or interconnections between the wettable metal pads 16 on the microelectronic device 10 and the solder-wettable terminals, contact pads or bond pads 18 on the substrate 12 are made simultaneously by reflowing the solder in the solder bumps or drops 14. Typically, such interconnections are made with solder bumps 14 which are about 100 to 150 $\mu$m (microns) in diameter with several hundred to several thousand solder bumps per chip. Manufacturing processes, however, are moving toward more interconnections per chip and thus require smaller solder bumps since the interconnections are closer together.

With regard to prior art methods of depositing solder through a mask plus reflow for creating solder bumps, the disadvantages include the high overall cost of the process. Furthermore, the quality and repeatability of the solder alloy is not good and the masks get coated with the solder materials and must be continuously cleaned or replaced.

With regard to the prior art method of depositing solder by electroplating plus reflow, the disadvantages of this process include high overall cost because of the photolithography process. Furthermore, the solder-plating step presents environmental waste treatment problems and solder alloys are not consistent and usually contain impurities.

With regard to the prior art method of depositing solder using the pick-and-place of solder bumps, the disadvantages of this process include high cost of the equipment needed. Furthermore, the process is not suitable for volume production and there is danger to individuals in the handling and controlling of the small solder balls.

For high density integrated circuit interconnections using flip-chip bonding, the major failure mechanism is failure of the solder bumps due to thermal expansion stress. The present invention provides an interconnection array which greatly reduces thermal expansion stress for a given thermal expansion mismatch between the high density integrated circuit chip and the substrate.

SUMMARY OF THE INVENTION

This invention provides solder interconnection arrays which are used to join a plurality of metallic surfaces (such as solder-wettable terminals or contact pads) located on a first surface to a plurality of metallic surfaces located on a second surface. The interconnection arrays of the invention reduce the amount of stress on the connections in the array caused by shear forces between the first surface and the second surface. The method includes the steps of positioning and maintaining a first surface in a controlled environment; aligning a device capable of ejecting drops of liquid solder which can be varied in volume from drop to drop to deliver the drops of liquid solder to an initial location on the first surface; providing relative movement between the first surface and the ejection device through a sequence of predetermined locations; activating the ejection device to cause drops of liquid solder to be delivered to metallic surfaces located on the first surface at each predetermined location in the sequence; and varying the volume and/or number the drops of liquid solder to form solid solder deposits which vary in diameter and height from the surface in accordance with a predetermined pattern.

Metallic surfaces on the first and second surfaces can then be joined by heating the surfaces and solder deposits to reflow the solder while causing relative movement between the first and second surfaces to place the solder deposits located on the plurality of metallic surfaces of the first surface in contact with the plurality of metallic surfaces of the second surface. Once the solder deposits have reflowed and all metallic surfaces or pads have been joined by the reflowed solder, the means for providing relative movement between the first and second surfaces can be removed.

BRIEF DESCRIPTION OF THE DRAWING

Other advantages and features of the invention will become more readily understood from the following detailed description taken in connection with the appended claims and accompanying drawing wherein like reference numerals have been applied to like elements, in which:

DETAILED DESCRIPTION OF PREFERRED EMBODIMENTS

Figure 1:
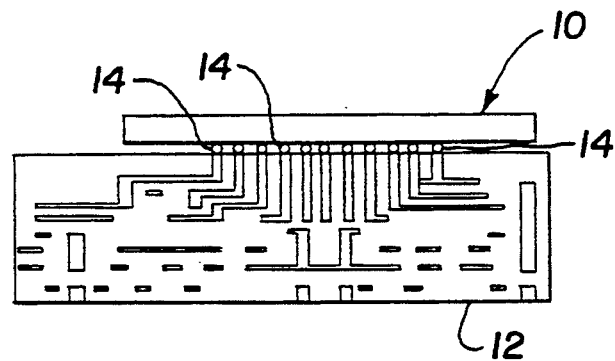
FIG. 1 is a simplified pictorial illustration of a prior art integrated circuit chip bonded to a substrate.
Figure 2:
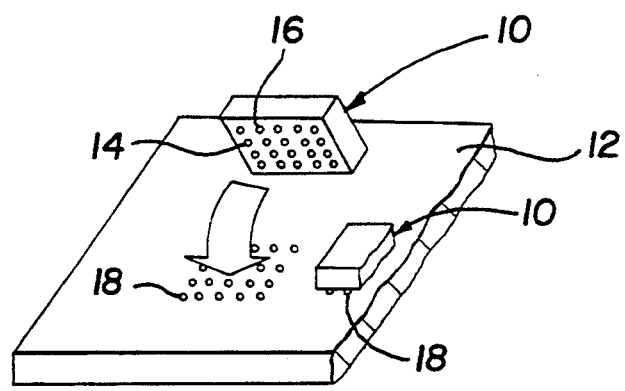
FIG. 2 is a simplified pictorial illustration of one step in the prior art process of bonding of an integrated circuit chip to a substrate.
Figure 3:
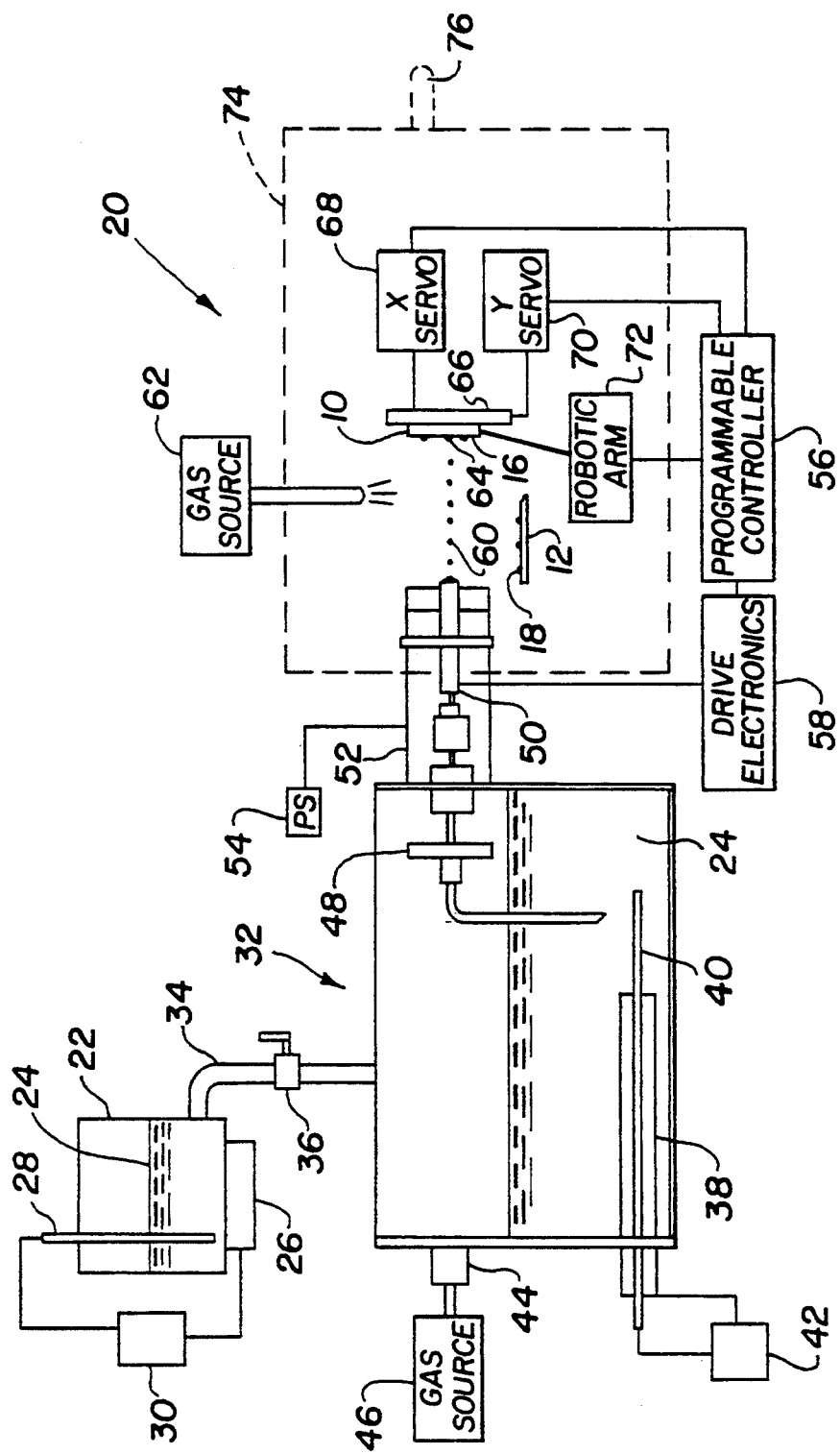
FIG. 3 is a simplified pictorial illustration of solder-dispensing apparatus used in practicing one form of the invention.

Solder ejecting apparatus suitable for practicing the invention is shown in FIG. 3 and generally designated by the reference character 20. The apparatus is capable of producing and ejecting spherically-shaped quantities of liquid solder in controlled amounts, the volume of each of which may be varied upon demand. The spherically-shaped quantities are ejected with great accuracy to very small soldering areas or surfaces (such as wettable metal contact pads on an integrated circuit chip and contact or bond pads on a packaging substrate) to provide a desired pattern of solder bumps or drops of different shapes and heights. As illustrated, solder-ejecting apparatus 20 comprises a preload reservoir 22 for initially receiving and holding liquid solder 24. Heating element 26 is operatively positioned with respect to preload reservoir 22 to maintain the solder 24 in the liquid state. Thermocouple 28 is operatively connected to control power source 30 which heats the solder 24 and maintains it at the required temperature.

An ejection chamber 32 is connected to the outlet of preload reservoir 22 through conduit 34 and valve 36 which allows liquid solder 24 to flow from the preload reservoir 22 into ejection chamber 32. Oxides and impurities tend to stay at the top of the liquid solder 24 in the preload reservoir 22 and do not enter the ejection chamber 32. Heating element 38 is operatively positioned in ejection chamber 32 to maintain the solder 24 in the liquid state. Thermocouple 40 is connected to control power source 42 so that solder 24 will be maintained at the required temperature. The ejection chamber 32 is pressurized through inlet port 44 by an inert gas such as argon from gas source 46. The pressurized gas forces liquid solder 24 through filter 48 into the ejection device 50 to purge the system in preparation for operation. In the preferred embodiment ejection device 50 comprises either a drop-on-demand ejection device (see FIG. 3) or a charge-and-deflection device and is employed to produce generally spherically-shaped drops 60 and direct them toward a target location. By appropriately positioning the target, the liquid drops 60 become solidified balls of solder adhering to the target in the form of solder bumps or balls 64 which remain generally spherical in shape. The target may be metallic surfaces, for example, wettable metal pads 16 on a microelectronic device package 10 such as a surface mount package, an integrated circuit chip, etc., or the wettable contact or bond pads 18 on a mounting substrate 12.

Although the ejection chamber 32 is not pressurized during operation, the space above the liquid solder 24 is filled with a relatively inert gas to eliminate oxygen from the chamber. Heater 52, operatively connected to power source 54, surrounds the ejection device 50 and controls the temperature of the liquid solder 24 within the ejection device 50. Programmable controller 56 provides activating signals to drive electronics 58 causing ejection device 50 to eject a drop or drops 60 of liquid solder 24 in a manner controlled by the particular program in programmable controller 56. Changes in the drive signal to ejection device 50 are used to change the sizes of the drops 60 of liquid solder 24.

The space surrounding the drop or drops 60 of liquid solder 24 between ejection device 50 and the target is preferably filled with relatively inert gas to eliminate oxygen from the path traveled by the drops 60. A gas source 62 provides a flow of inert gas into the space traveled by the drops 60 and the area where the drops 60 land on the target. In the preferred embodiment, solder bumps or drops 64 are generally spherical in shape and can be provided in sizes which range in diameter from about twenty (20) $\mu$m to about two hundred (200) $\mu$m, the size of the solder bumps or drops 64 varying with the size of the nozzle of the ejection device 50 and the magnitude and width or shape of pulses from drive electronics 58.

In one embodiment an X-Y table 66 is provided on which the target surface is mounted. The X-Y table 66 is equipped with an X-axis positioning servo 68 and a Y-axis positioning servo 70. Programmable controller 56 is operatively connected to the X-axis positioning servo 68 and the Y-axis positioning servo 70 and provides programmed control signals thereto to move the X-Y table 66 to a particular desired location and/or a predetermined sequence of locations with respect to ejection device 50.

As illustrated in FIG. 3, a robotic arm 72 may be provided to control the position of the target surface. Programmable controller 56, operatively connected to robotic arm 72, provides programmed control signals to move the target to particular locations and/or a predetermined sequence of locations with respect to ejection device 50.

The atmosphere in the ejection chamber 32, the path traveled by the drops 60 of liquid solder 24 and the space surrounding the target surface may be reducing or inert but should at least be reduced in oxygen to the point where the drops 60 of liquid solder 24 and the target will not be subject to oxidation. The inert atmosphere also greatly enhances formation of generally spherically-shaped drops of liquid solder which solidify into generally spherical balls. As previously noted, an inert gas may be blown by gas source 62 into the space surrounding the path traveled by the drops 60 and the space surrounding the target surface.

It will be appreciated that a chamber or housing 74 enclosing the path traveled by the drops 60 of liquid solder 24 and the space surrounding the target surface will further insure that the target will not be subject to oxidation during deposition of solder balls thereon. The housing 74 may be used to provide a positive gas flow from gas source 62 to outlet or exhaust port 76. Thus any oxides and/or contaminants will flow out exhaust port 76 along with the inert gas.

Operation of the apparatus illustrated in FIG. 3 begins with placing solid solder in preload reservoir 22. In the preferred embodiment the solder comprises a eutectic of at least two of the elements lead, tin, bismuth and indium. One such solder alloy is 63/57 tin/lead. Power is applied to heating element 26 to bring the temperature of the solder to its melting point. After the solder is melted in the preload reservoir 22, a portion thereof is transferred through conduit 34 and valve 36 to the ejection chamber 32 where the solder 24 is maintained liquid by heating element 38. Ejection chamber 32 is pressurized with relatively inert gas such as nitrogen or argon at a pressure of from about ten (10) to about thirty (30) psi. The pressurized gas forces liquid solder 24 through filter 48 and into ejection device 50. Ejection device 50 has a nozzle opening about twenty-five (25) to about one hundred fifty (150) microns in diameter and is excited with signals from drive electronics 58 having a frequency typically less than about ten thousand (10,000). Drop-on-demand operation allows for production of single drops of solder.

Operation of the apparatus is discussed hereinafter with reference to wettable pads 16 on a microelectronic device 10 as the receiving target surface for the solder bumps or balls 64. It will be appreciated that substrate 12 or any other suitable target surface could be used.

The ejection device 50 is aligned with its output directed to the wettable metal pad 16 on microelectronic device 10 when the microelectronic device 10 is located to an initial position. The system is then activated with programmable controller 56 providing control signals to the X-axis positioning servo 68 and the Y-axis positioning servo 70 so that relative movement occurs between ejection device 50 and microelectronic device 10. In the preferred embodiment, the X-Y table 66 moves through a predetermined sequence of locations with respect to the output location of the ejection device 50. At each desired or designated location the X-Y table 66 is stopped and the ejection device 50 activated by the programmable controller 56 and drive electronics 58 to eject a drop or drops 60 of liquid solder 24 onto the portion of the wettable metal pad 16. Changes in the amount or volume of the drop or drops 60 is controlled by the excitation voltage provided to ejection device 50 by drive electronics 58. This sequence is repeated until all the wettable metal pads 16 have one or more individual solder bumps or balls 64 formed thereon. Changing layouts or locations of wettable metal pads 16 on the microelectronic device 10 only requires a program change to the programmable controller 56.

It will be appreciated that the X-axis positioning servo 68 and the Y-axis positioning servo 70 could be connected to ejection device 50 to move the ejection device 50 through a predetermined sequence of locations rather than move the microelectronic device 10. In the preferred embodiment the ejection device 50 comprises a piezoelectric transducer which ejects liquid solder in response to an excitation signal. Such ejection devices are easily adjusted to control the size of the solder bumps or balls 64. Small changes in diameter (and volume) of the solder bump or ball 64 require only changes in the excitation voltage pulse. Large changes require changes in the size of the crifice in the ejection device 50.

Figure 4:
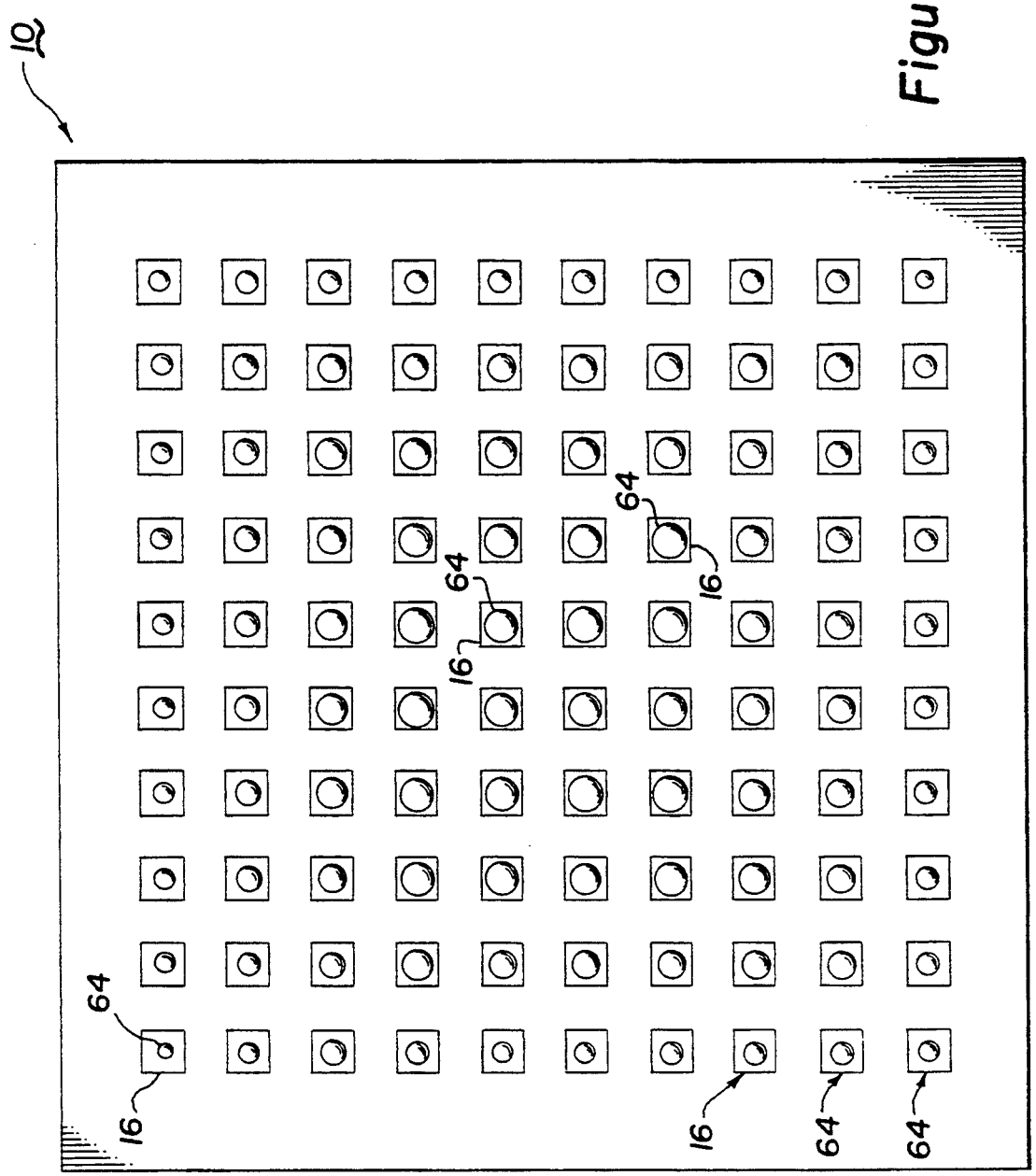
FIG. 4 is a simplified top plan view of a pattern of solder bumps positioned on interconnection pads in accordance with the present invention.
Figure 5:
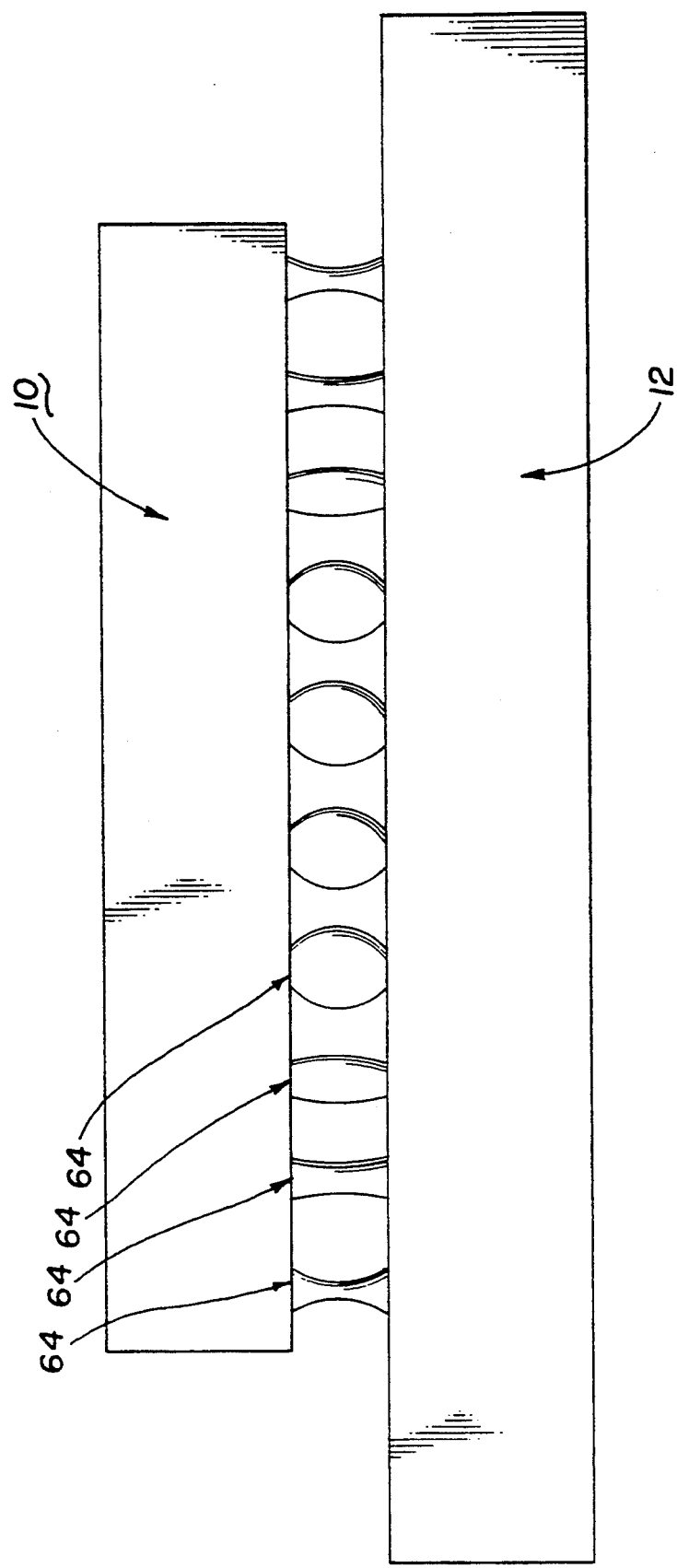
FIG. 5 is a simplified side elevational view of the interconnection array f FIG. 4 after solder reflow.

FIGS. 4 and 5 depict the surface of an exemplary microelectronic device 10 with solder bumps, drops or balls 64 deposited on wettable metal pads 16 in accordance with the present invention using the apparatus of FIG. 3. Microelectronic device 10 is operatively mounted on X-Y table 66. Ejection device 50 is aligned with its output directed to an initial position aligned with a metallic surface on the surface of microelectronic device 10. The system is then activated with programmable controller 56 providing control signals to the X-axis positioning servo 68 and the Y-axis positioning servo 70 so that the X-Y table 66 moves through a predetermined sequence to align the output location of ejection device 50 with metallic surfaces 16. At each desired or designated location the X-Y table 66 is stopped and ejection device 50 is activated by programmable controller 56 and drive electronics 58 to eject a drop or drops 60 representing a designated volume of liquid solder 24 onto the wettable metal pads 16 to provide solder bumps of different sizes in a predetermined pattern such as illustrated in FIG. 4.

After all or a predetermined number of the wettable metal pads 16 have received solder bumps or balls 64, robotic arm 72 places microelectronic device 10 on substrate 12 so that solder bumps or balls 64 are in alignment with respective wettable contact or bond pads 18 and the taller solder bumps or balls 64 are in contact with their respective wettable contact or bond pads 18. When properly heated, the solder bumps or balls 64 melt and reflow. During reflow, robotic arm 72 moves microelectronic device 10 toward substrate 12 until all the solder bumps or drops 64 on the microelectronic device 10 contact the aligned wettable contact or bond pads 18 and join the wettable metal pads 16 to wettable contact pads 18 as shown in FIG. 5. After all pads 18 are wetted, robotic arm 72 may be released from microelectronic device 10.

The primary purpose four depositing different sizes of solder bumps or drops 64 at different locations on the wettable metal pads 16 is to reduce the stress on a particular area of the interconnection array caused by shear stress between the microelectronic device 10 and substrate 12. It will be appreciated that the terms "interconnection array" and "solder interconnection array" refer to the patterned deposits of solder which connect the wettable metal pads 16 on microelectronic device 10 to the solder-wettable terminals or contact pads 18 on the substrate 12. The smaller deposits of solder bumps or drops 64 result in taller and thinner (in diameter) connections of solder in the interconnection array (see FIG. 5) resulting in less stress on the connection for a given amount of shear movement between the microelectronic device 10 and substrate 12.

Figure 6:
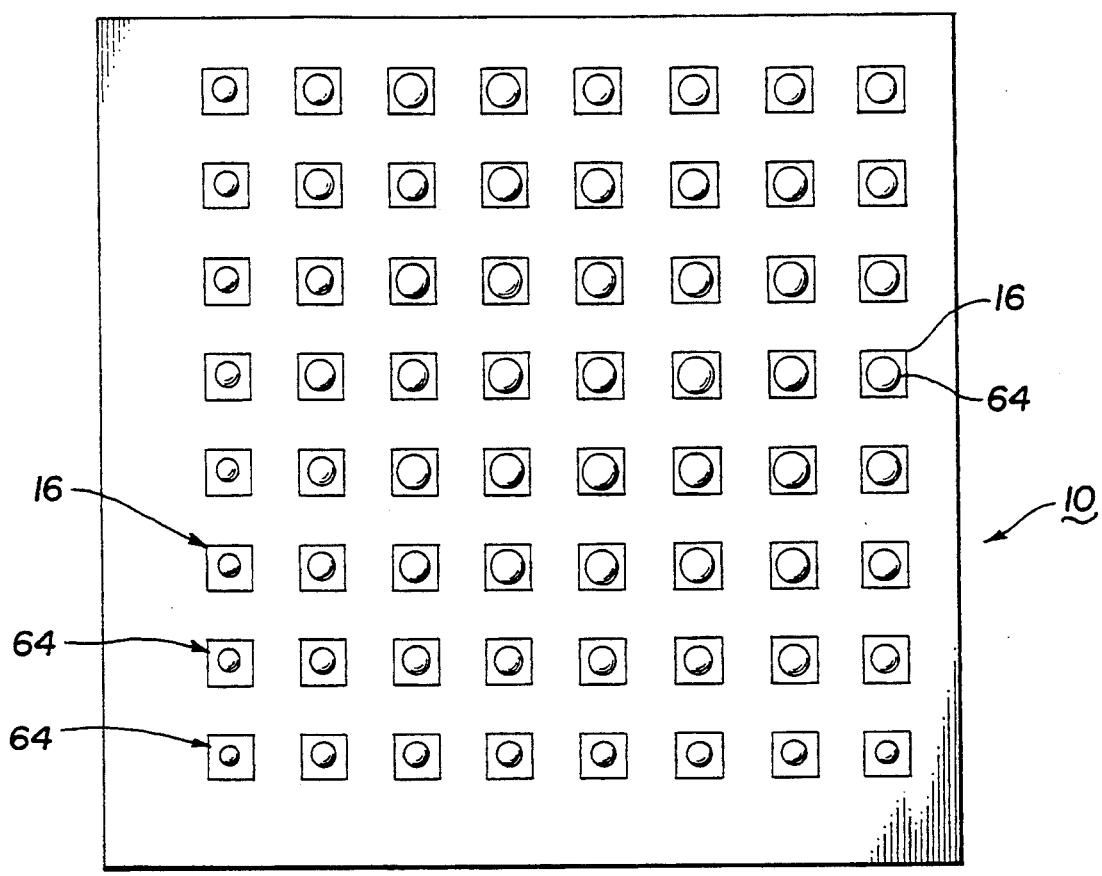
FIG. 6 is a simplified top plan view of a different pattern of solder bumps positioned on interconnection pads in accordance with the present invention.
Figure 7:
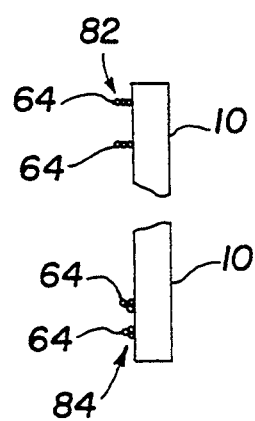
FIG. 7 is a simplified pictorial illustration of drops of solder stacked on wettable metal pads in accordance with the present invention.

FIGS. 4 and 5 depict only one embodiment or representation of the arrangement of various sizes of solder bumps, drops or balls 64 which may be formed in accordance with the invention. FIG. 6 depicts an additional embodiment or representation of the arrangement of various sizes of solder bumps, drops or balls 64 which may be formed in accordance with the invention. As illustrated in FIG. 7, the drops 60 of liquid solder 24 may be deposited one drop or ball 64 on top of another drop or ball 64, etc., to form a stack 82 or may be deposited in a pyramid 84, depending upon the size and shape of the wettable target. As previously noted, higher and thinner stacks of solder bumps or balls 64 tend to provide better reliability during temperature cycling because they are flexible and less susceptible to shear stress in the solder joint. It will be appreciated that depositing the solder bumps or balls 64 on wettable contact or bond pads 18 on substrate 12 rather than the wettable metal pads 16 on microelectronic device 10 will produce identical results.

At least two methods may be used to provide the taller, thinner interconnections as shown at the outer ends of the array of FIG. 5. Small solder bumps or drops 64 may be deposited on the designated wettable metal pads 16 and, during reflow of the solder, microelectronic device 10 pushed toward the substrate 12 by robotic arm 72 until all the solder bumps or drops 64 on the microelectronic device 10 have contacted the respective wettable contact or bond pads 18. Robotic arm 72 may then raise the microelectronic device 10 to the final desired position as shown in FIG. 5 and the solder allowed to solidify. This stretches the smaller drops. Another method comprises depositing multiple small solder bumps or drops 64 on top of each other to provide a stack of solder bumps which are the same general height as the larger solder bumps or drops 64. With this method, robotic arm 72 need only place microelectronic device 10 onto substrate 12 so that solder bumps or balls 64 contact respective wettable contact or bond pads 18 and hold that position during reflow and solidification of the solder.

Areas of the interconnection array which are subjected to destructive stress may be determined by computer modeling and/or by testing connected microelectronic devices and substrates, etc. The height and size of the solder bumps or balls and their particular pattern of placement may then be accurately determined for minimization of stress. Control of the size (volume), height and placement of the solder bumps or balls may be provided in the software for the programmable controller 56 so that the pattern of deposited solder bumps or balls is automatically provided by the apparatus which includes the programmable controller 56.

From the foregoing, it will be appreciated that the present invention provides an effective method of providing increased reliability of solder interconnection arrays during temperature cycling. Although the invention has been described with particular reference to presently preferred embodiments thereof, various modifications, alterations, variations, etc., may be made without departing from the spirit and scope of the invention as defined by the appended claims.

What is claimed:

1. The method of making a solder interconnection array on a first surface comprising the steps of:
   (a) positioning and maintaining a first surface having a plurality of predetermined locations in a controlled environment;
   (b) providing an ejection device capable of ejecting drops of liquid solder which may vary in volume from drop to drop;
   (c) aligning said ejection device to deliver drops of liquid solder to an initial location on said first surface;
   (d) providing a sequence of relative movements between said ejection device and said first surface to align said ejection device with a plurality of locations on said first surface in a predetermined sequence; and
   (e) activating said ejection device to cause drops of liquid solder to be ejected and delivered to each of said predetermined locations and form solid solder deposits which vary in diameter and height in accordance with a predetermined pattern.

2. The method set forth in claim 1 wherein said controlled environment is relatively inert.

3. The method set forth in claim 1 wherein said controlled environment excludes oxygen.

4. The method set forth in claim 1 wherein said predetermined number of drops of liquid solder comprises one drop.

5. The method set forth in claim 1 wherein said predetermined number of drops of liquid solder comprises more than one drop.

6. The method set forth in claim 1 wherein said first surface is moved relative to said ejection device.

7. The method set forth in claim 1 wherein said first surface comprises the surface of a substrate for an electronic device.

8. The method set forth in claim 1 wherein said first surface comprises the surface of a microelectronic device.

9. The method set forth in claim 8 wherein said microelectronic device comprises a surface mount package.

10. The method set forth in claim 8 wherein said microelectronic device comprises an integrated circuit chip.

11. The method set forth in claim 1 further including the steps of:
    (a) providing a second surface having a plurality of locations thereon arranged in a mirror image pattern with respect to the plurality of locations on said first surface;
    (b) positioning and maintaining said second surface in said controlled environment;
    (c) causing relative movement between said first surface and said second surface to place said solid solder deposits located on said first surface in alignment with said plurality of locations on said second surface;
    (d) heating said first surface to cause said solder deposits to reflow; and
    (e) positioning said first and second surfaces to cause the reflowed solder to wet the plurality of locations on said first surface and said second surface.

12. The method of making an interconnection array for joining a plurality of metallic surfaces located on a first body to a plurality of metallic surfaces located on a second body comprising the steps of:
    (a) positioning and maintaining a surface of a first body having a plurality of metallic surfaces thereon and the surface of a second body having a plurality of metallic surfaces thereon in a controlled environment;
    (b) aligning an ejection device capable of ejecting drops of liquid solder which can be varied in volume from drop to drop to deliver drops of liquid solder to an initial metallic surface on one of said first body and said second body;
    (c) moving said one of said first body and said second body sequentially through a predetermined plurality of locations;
    (d) activating said ejection device to cause a predetermined number of drops of liquid solder to be delivered to metallic surfaces on said one of said first body and said second body when positioned at each of said predetermined plurality of locations and form a solid solder deposit thereon which varies in diameter and height in accordance with a predetermined pattern.

13. The method set forth in claim 12 wherein said controlled environment is relatively inert.

14. The method set forth in claim 12 wherein said controlled environment excludes oxygen.

15. The method set forth in claim 12 wherein said predetermined number of drops of liquid solder comprises one drop.

16. The method set forth in claim 12 wherein said predetermined number of drops of liquid solder comprises more than one drop.

17. The method set forth in claim 12 wherein said first body comprises a substrate for an electronic device.

18. The method set forth in claim 12 wherein said first body comprises a microelectronic device.

19. The method set forth in claim 18 wherein said microelectronic device comprises a surface mount package.

20. The method set forth in claim 18 wherein said microelectronic device comprises an integrated circuit chip.

21. The method set forth in claim 12 further including the steps of:
(a) causing relative movement between said first body and said second body to place said solid solder deposits located on the surface of one body in alignment with said plurality of metallic surfaces located on the surface of the other body;
(b) heating said bodies to cause said solid solder deposits to reflow; and
(c) positioning said first and second bodies to cause the reflowed solder to wet the plurality of metallic surfaces located on said first body and said second body.

* * * * *

UNITED STATES PATENT AND TRADEMARK OFFICE
CERTIFICATE OF CORRECTION

PATENT NO. : 5,377,902

DATED : January 03, 1995

INVENTOR(S) : Donald J. Hayes

It is certified that error appears in the above-identified patent and that said Letters Patent is hereby corrected as shown below:

Col. 5, line 49, change "crifice" to read ---orifice---
Col. 6, line 20, change "four" to read ---for---

Signed and Sealed this

Twenty-eight Day of March, 1995

Attest:

BRUCE LEHMAN

*Attesting Officer*   *Commissioner of Patents and Trademarks*